United States Patent [19]

Pankove et al.

[11] 4,113,514
[45] Sep. 12, 1978

[54] METHOD OF PASSIVATING A SEMICONDUCTOR DEVICE BY TREATMENT WITH ATOMIC HYDROGEN

[75] Inventors: Jacques Isaac Pankove; Murray Alfred Lampert, both of Princeton, N.J.

[73] Assignee: RCA Corporation, New York, N.Y.

[21] Appl. No.: 869,641

[22] Filed: Jan. 16, 1978

[51] Int. Cl.² ............... H01L 21/26; H01L 21/265
[52] U.S. Cl. ............................... 148/1.5; 148/187; 357/13; 357/91
[58] Field of Search .................. 204/164; 427/38; 357/13, 59, 91; 148/1.5, 187

[56] References Cited

U.S. PATENT DOCUMENTS

| | | | |
|---|---|---|---|
| 3,390,011 | 6/1968 | Brown et al. | 117/201 |
| 3,859,127 | 1/1975 | Lehner | 117/212 |
| 3,943,014 | 3/1976 | Yoshizawa | 148/187 |
| 4,013,485 | 3/1977 | Ma et al. | 148/1.5 |
| 4,056,408 | 11/1977 | Bartko et al. | 148/1.5 |

OTHER PUBLICATIONS

Appelbaum et al., "Hydrogen Chemisorption on Si . . .", Phys. Rev. Letts. 39, (1977), 1487.
Pankove et al., "Photoluminescence of Hydrogenated . . . Si", Appl. Phys. Letts. 31, (1977), 450.
Sakurai et al., "Hydrogen Chemisorption on . . . Si . . .", J. Vac. Sci. Techn. 13, (1976), 807.
Gorelkinskii et al., "Epr . . . in Si by $H^+$ Implantation", Phys. Stat. Solid; k55, vol. 22(a), 1974.
Brodsky, "Making Higher Efficiency Solar Cells. . .", IBM – TDB, 18, (1975), 582.
Stein, "Bonding and . . . Implanted H in Si", J. Electron. Mat. 4, (1975), 159.
Ibach et al., "Hydrogen Adsorption . . . of Si", Surf. Science, 43 (1974), 481.
Ohmura et al., "Shallow Donor . . . in Si . . . by $H^+$ . . .", Phys. Stat. Solid, 15a, (1973), 93.
Ohmura et al., "Electrical Properties of n-type Si . . .", Solid St. Comm. 11, (1972), 263.

Primary Examiner—L. Dewayne Rutledge
Assistant Examiner—Upendra Roy
Attorney, Agent, or Firm—H. Christoffersen; D. S. Cohen; T. H. Magee

[57] ABSTRACT

A method of passivating a semiconductor device having at least one active component disposed therein comprises exposing the device to atomic hydrogen at a temperature lower than about 450° C.

4 Claims, 2 Drawing Figures

METHOD OF PASSIVATING A SEMICONDUCTOR DEVICE BY TREATMENT WITH ATOMIC HYDROGEN

This invention relates to a method of passivating a semiconductor device in order to reduce the undesirable effects of recombination/generation centers on the active components of the device.

The operating performance of a semiconductor device having active components disposed therein is frequently degraded by the removal of charge carriers needed for the operation of the device, and by the generation of unwanted charge carriers, thereby increasing power dissipation and noise. From the early history of germanium and silicon single-crystal semiconductor physics, it is known that such semiconductor material contains dangling bonds which are potent minority-carrier lifetime killers. These dangling bonds are responsible for states in the energy gap which, depending on the applied bias, either remove the charge carriers needed for the operation of the device or generate unwanted charge carriers. Dangling bonds occur primarily at the surface of the device and are responsible for the so-called "surface recombination". Dangling bonds also occur at vacancies, micropores, dislocations, and are associated with certain impurities.

We have recently observed that the formation of amorphous silicon (a-Si) by the glow-discharge decomposition of silane results in a hydrogen-rich material. A method of depositing a body of amorphous silicon on a substrate in a glow-discharge apparatus is described in U.S. Pat. No. 4,064,521, which issued to D. E. Carlson on Dec. 20, 1977 and is assigned to RCA Corporation. We have reported that a-Si produced by the glow-discharge decomposition of silane may contain approximately 18 to 50 atomic percent of hydrogen. Most of this hydrogen is believed to be valence-bonded to silicon atoms in the amorphous network as Si—H bonds. Heating the H-doped a-Si in vacuum causes a measureable evolution of hydrogen. When a-Si:H is thermally dehydrogenated, the residue is in the form of Si which is extremely rich in dangling bonds. With this in mind, we have correlated the decreasing photoluminescence efficiency of a-Si:H with hydrogen evolution during annealing, suggesting that the dangling bonds left in the material by the outgassing of hydrogen are effective sites for non-radiative recombination, as they are in single-crystal Si.

The present invention provides a technique for neutralizing the dangling bonds existing in a semiconductor device, thereby passivating the device by reducing the number of recombination/generation centers in the device. We also show that, in the case of single-crystal silicon, a PN junction in the crystal can be a very sensitive and convenient detector of such dangling bonds.

Figure 1:
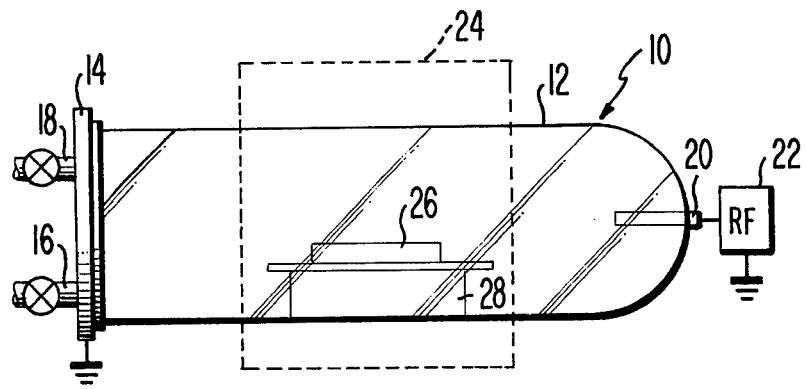
FIG. 1 is a diagrammatic elevation view illustrating one embodiment of an apparatus utilized to practice the present novel method.

Referring to FIG. 1 of the drawings, there is shown a glow-discharge apparatus suitable for carrying out the present novel passivation method. The apparatus comprises an evacuation chamber 10 which includes a glass tube 12 bolted to a base plate 14, with a rubber sealing gasket (not shown) therebetween. The tube 12 is evacuated by means of a first opening 16 in the base plate 14 which is connected to a mechanical vacuum pumping system (not shown). A second opening 18 is connected to a gas bleed-in system (not shown) which provides a source of molecular hydrogen ($H_2$) for the chamber 10. At the end of the glass tube 12 opposite the base plate 14 is an electrode 20 connected to a Tesla coil 22 for developing a high-voltage discharge at an rf frequency. A furnace, illustrated by dotted line 24 in FIG. 1, surrounds the tube 12 in the location at which the semiconductor device is to be placed.

In carrying out the present passivation method, a semiconductor device 26, having at least one active component therein, such as a silicon diode in the present example, is placed on a support 28 within the chamber 10. An active component refers to an active element within the device 26 which exhibits transistance, i.e., a capability of controlling voltages or currents so as to produce gain or switching action in a circuit, such as amplification or rectification. In other words, the semiconductor device 26 has an active component therein, such as a diode, transistor, or thyristor, whose performance would be degraded by the removal of needed charge carriers or by the generation of unwanted charge carriers, and thus, whose passivation thereof would have a beneficial effect on the operating performance of the device 26.

The chamber 10 is then evacuated through the first opening 16 by means of the mechanical pumping system, while the furnace 24 preferably heats the device to a temperature below about 450° C. In the present example, the device 26 was heated to a temperature of approximately 200° C.

Purified hydrogen gas ($H_2$) is next introduced into the chamber 10 through the second opening 18 to a pressure that will sustain an optimum glow discharge from the electrode 20. The pressure should be below about 5 Torr; in the present example, the $H_2$ was maintained at a pressure of approximately 0.5 Torr.

In the preferred embodiment, the molecular hydrogen ($H_2$) within the chamber 10 is now subjected to a glow discharge from the electrode 20, in order to generate atomic hydrogen. Instead of using a Tesla coil 22, the glow discharge can also be generated by a high-frequency continuous-wave oscillator coupled either inductively or capacitively to the low-pressure hydrogen. Although such a glow discharge generates several different species of hydrogen, we desire to produce atomic hydrogen in order that such hydrogen might readily bind to dangling silicon bonds. The exposure to the atomic hydrogen may last from a few minutes to several hours. In the present example, we exposed the device 26 for approximately 10 minutes. Although we utilize a glow-discharge apparatus for producing the atomic hydrogen in the present embodiment, any other apparatus means for generating atomic hydrogen may be utilized, such as by thermal dissociation of $H_2$ utilizing a hot filament ($\sim$ 2000° C.), or by electron bombardment of $H_2$ near the surface to be passivated. A glow-discharge technique is preferred as the simplest method of generating atomic hydrogen since this technique combines field ionization, electron bombardment and ionic collisions.

We have discovered that by using the present novel technique it is possible to neutralize the dangling bonds existing in a semiconductor device by attaching a hydrogen atom to each dangling bond. The H atoms bond to a dangling orbital at each surface Si atom to form a hydride (Si:H, Si:H$_2$ or Si:H$_3$). Experiments were conducted which showed that effective device passivation cannot be achieved by exposing the device to molecular hydrogen (H$_2$), such as by exposure to forming gas.

Silicon samples were subjected to molecular hydrogen, repeating the entire procedure described above, but without the glow discharge so that no atomic hydrogen was present. Both these samples and samples treated by the present novel method were then annealed by exposure to a temperature ramp for 30 minutes in a closed evacuated vessel connected to a pressure gauge, which monitored the evolution of hydrogen. In the samples exposed to the atomic hydrogen, we found that hydrogen evolution begins at about 300° C. and is completed at about 550° C. Mass spectroscopy was used to verify that hydrogen was the dominant (> 90%) gaseous species in the vessel after the annealing treatment. Knowing the volume and pressure of the gas in the vessel, it was possible to calculate the amount of H$_2$ evolved, and knowing the volume of the semiconductor material, it was possible to determine the concentration of hydrogen in the sample. However, in the samples exposed only to molecular hydrogen, no gas evolution was observed during the temperature ramp. This result was expected since it is well-known, for example, that a silicon single crystal cleaved in a molecular hydrogen atmosphere does not form Si—H bonds at the surface, even though it is energetically favorable to do so. (The dangling silicon bonds created by the cleavage are too far apart to see simultaneously the two hydrogen atoms in H$_2$ without first dissociating the molecules). Although the negative result with molecular hydrogen was entirely expected, it was necessary as a control for the glow-discharge experiment.

Figure 2:
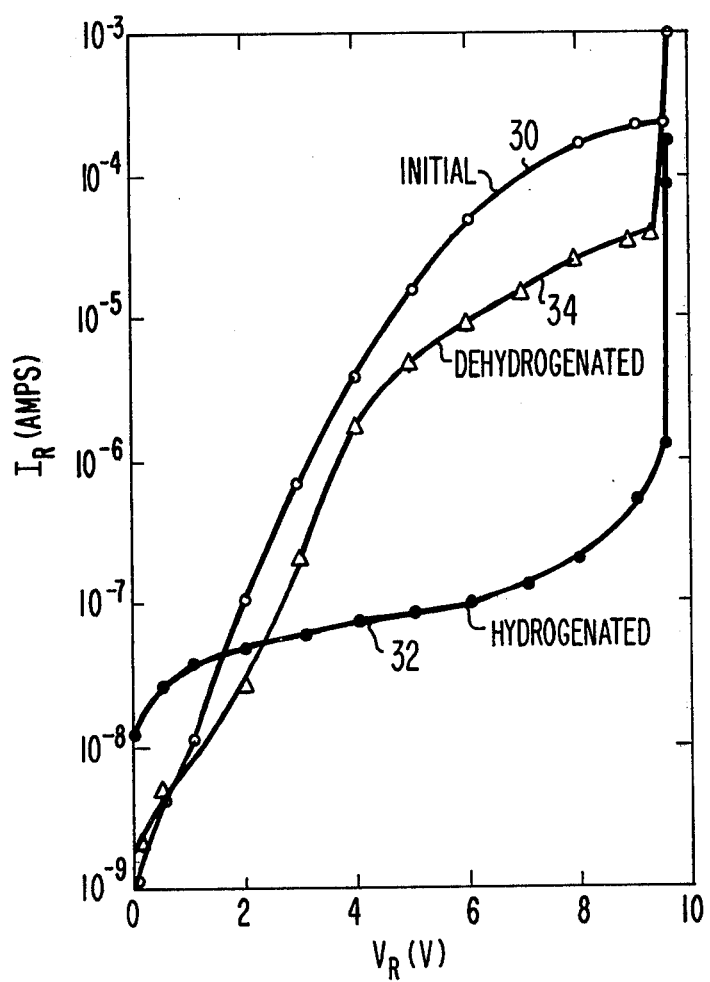
FIG. 2 is a diagram of the I—V characteristics of a reverse-biased PN junction in crystalline Si before and after hydrogenation, and also after dehydrogenation.

In order to determine the effect such hydrogenation treatment has on a semiconductor device, we conducted experiments with single-crystal Si using a PN junction as a detector of rehydrogenated dangling bonds. An array of commercial-grade PN junctions was fabricated by an N+ diffusion into a P+ Si substrate. Each junction has a cross-section of 0.03 cm$^2$ and a surface periphery of 1.2 cm. A thermal oxide, which formed on the surface of the device, was etched off, and the Si surface was cleaned using standard cleaning procedures known in the art and baked dry at 200° in nitrogen. The PN junction was then reverse-biased, and the I(V) reverse-current characteristics were measured and are illustrated as the top curve 30 shown in FIG. 2. The diode was quite leaky, indicating the presence of a large number of dangling bonds, and, thus, was particularly suitable for the present studies. Next, the silicon diode was hydrogenated, in the manner described above, that is, first heating the diode structure in vacuum at approximately 200° C., then introducing H$_2$, producing a glow discharge for about 10 minutes and cooling slowly to room temperature. After this hydrogenation treatment, the reverse-biased I(V) characteristic shows a dramatic drop in leakage current above 1.5 volts, and a great sharpening of the breakdown; see the bottom curve 32 illustrated in FIG. 2. The diode structure was then dehydrogenated, by applying a temperature ramp as described above, and subjected to HF etching and cleaning. After this dehydrogenation treatment, the I(V) characteristic reverts back toward the original soft breakdown, as shown by the middle curve 34 of FIG. 2. An incomplete dehydrogenation is probably indicated by the slightly lower leakage than in the original diode. The I(V) characteristics of all diodes in the array were affected in a similar fashion; from diode to diode the current varied by less than a factor of two. Exposure of virgin diodes to only molecular hydrogen lowers the current by a factor of five. Subsequent exposure to atomic hydrogen, via the present novel glow-discharge technique, gives a further depression of the leakage current by two orders of magnitude, bringing it down to the hydrogenated curve 32 illustrated in FIG. 2.

It is emphasized that the present novel invention is not the discovery of hydrogen chemisorption on a silicon surface, but rather a method which is effective for passivating a semiconductor device. In other words, we have demonstrated that hydrogenation is an effective technique for reducing the number of recombination/regeneration centers in a semiconductor device by neutralizing the dangling bonds contained therein. Since all the hydrogen escapes the dangling bonds at temperatures greater than about 550° C., the hydrogenation must be performed at sufficiently low temperatures, i.e., less than about 450° C., and subsequently, the device must be kept below the dehydrogenation temperature. We have demonstrated that dangling bonds in both amorphous and single-crystal silicon can be rehydrogenated by atomic but not by molecular hydrogen. More important, we have discovered that such a rehydrogenation technique effectively neutralizes dangling bonds to the extent that they do not degrade the performance of active semiconductor components by removing needed charge carriers or by generating unwanted charge carriers. Thus, the present method is a simple and effective passivation technique for decreasing power dissipation and noise in the active components of a semiconductor device.

What is claimed is:

1. A method of passivating a semiconductor device having at least one active component disposed therein comprising exposing said device to atomic hydrogen at a temperature lower than about 450° C.

2. A method as recited in claim 1 wherein said exposing step is performed by subjecting molecular hydrogen gas (H$_2$) to a glow discharge within a chamber at a pressure below about 5 Torr.

3. A method as recited in claim 1 wherein said exposing step is performed for approximately 10 minutes.

4. A method as recited in claim 1 wherein said semiconductor device comprises a silicon wafer having a PN junction disposed therein.

* * * * *